(12) United States Patent
Fujino et al.

(10) Patent No.: US 11,395,418 B2
(45) Date of Patent: Jul. 19, 2022

(54) TUNER MODULE AND RECEIVING DEVICE

(71) Applicant: Sony Semiconductor Solutions Corporation, Kanagawa (JP)

(72) Inventors: Toyomi Fujino, Kanagawa (JP); Koki Hino, Tokyo (JP); Tadashi Imai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 33 days.

(21) Appl. No.: 16/766,060

(22) PCT Filed: Oct. 5, 2018

(86) PCT No.: PCT/JP2018/037337
§ 371 (c)(1),
(2) Date: May 21, 2020

(87) PCT Pub. No.: WO2019/106957
PCT Pub. Date: Jun. 6, 2019

(65) Prior Publication Data
US 2020/0352040 A1 Nov. 5, 2020

(30) Foreign Application Priority Data
Nov. 28, 2017 (JP) .............................. JP2017-227782

(51) Int. Cl.
*H05K 5/00* (2006.01)
*H04N 21/426* (2011.01)
(Continued)

(52) U.S. Cl.
CPC ......... *H05K 5/0069* (2013.01); *H04N 21/426* (2013.01); *H05K 5/0217* (2013.01); *H05K 7/1427* (2013.01)

(58) Field of Classification Search
CPC .. H05K 7/1427; H05K 5/0217; H05K 5/0069; H04N 21/426
See application file for complete search history.

(56) References Cited

U.S. PATENT DOCUMENTS 5,974,095 A * 10/1999 Kitaura .................... H04N 5/52
348/E5.115
7,224,953 B2 * 5/2007 Hosoi .................. H04N 21/426
455/301
(Continued)

FOREIGN PATENT DOCUMENTS

CN 1219821 A 6/1999
CN 1659787 A 8/2005
(Continued)

OTHER PUBLICATIONS

International Search Report issued in International Patent Application No. PCT/JP2018/037337 dated Dec. 18, 2018 and English translation of same. 5 pages.
(Continued)

*Primary Examiner* — Rockshana D Chowdhury
*Assistant Examiner* — Douglas R Burtner
(74) *Attorney, Agent, or Firm* — K&L Gates LLP

(57) ABSTRACT

A tuner module includes an input connector a tuner case, a circuit board, and an auxiliary piece. The auxiliary piece contacts a surface of the tuner case and is fixed to the surface of the tuner case, and part of the auxiliary piece is connected as a ground potential near a contact of a core wire of the input connector with the circuit board.

8 Claims, 14 Drawing Sheets

(51) Int. Cl.
*H05K 5/02* (2006.01)
*H05K 7/14* (2006.01)

(56) References Cited

U.S. PATENT DOCUMENTS

| | | | | |
|---|---|---|---|---|
| 7,692,520 B2* | 4/2010 | Kim | ............ | H04B 1/0064 348/731 |
| 7,749,017 B2* | 7/2010 | Yamamoto | ............ | H05K 9/0022 439/63 |
| 8,928,434 B2* | 1/2015 | Kwon | ............ | H04N 21/426 334/85 |
| 2004/0077329 A1* | 4/2004 | Asano | ............ | H05K 9/006 455/325 |
| 2004/0252448 A1* | 12/2004 | Krajecki | ............ | H05K 5/0217 361/679.01 |
| 2005/0083441 A1* | 4/2005 | Fujiwara | ............ | H04N 5/44 725/100 |
| 2005/0227744 A1* | 10/2005 | Chiang | ............ | H05K 9/006 455/575.8 |
| 2006/0050186 A1* | 3/2006 | Hosoi | ............ | H05K 9/006 348/E5.097 |
| 2006/0112407 A1 | 5/2006 | Kakiuchi | | |
| 2007/0056017 A1* | 3/2007 | Takatori | ............ | H04N 21/426 725/151 |
| 2007/0058093 A1* | 3/2007 | Azuma | ............ | H04N 21/426 348/836 |
| 2007/0103597 A1* | 5/2007 | Shintani | ............ | H04N 5/50 348/E5.097 |
| 2007/0139558 A1* | 6/2007 | Reineke | ............ | H04N 9/641 348/E5.103 |
| 2007/0216806 A1* | 9/2007 | Maehara | ............ | H04N 21/426 348/565 |
| 2007/0242165 A1* | 10/2007 | Naito | ............ | H04N 5/46 348/731 |
| 2008/0049949 A1* | 2/2008 | Snider | ............ | H05K 5/0217 381/86 |
| 2011/0111712 A1* | 5/2011 | Miyamoto | ............ | H04N 21/426 455/150.1 |
| 2012/0019731 A1* | 1/2012 | Imai | ............ | H04N 5/64 348/731 |
| 2012/0174179 A1* | 7/2012 | Kwon | ............ | H04N 21/426 725/127 |
| 2012/0264384 A1* | 10/2012 | Imai | ............ | H05K 9/006 455/150.1 |
| 2013/0083495 A1* | 4/2013 | Moon | ............ | H04N 5/64 361/736 |
| 2013/0286295 A1* | 10/2013 | Takahashi | ............ | H04N 5/64 361/752 |
| 2013/0308255 A1* | 11/2013 | Sasaki | ............ | G06F 1/1601 361/679.01 |
| 2013/0347051 A1* | 12/2013 | Bose | ............ | H05K 7/20509 725/151 |
| 2014/0168519 A1* | 6/2014 | Imai | ............ | H04N 21/4263 348/731 |
| 2014/0320746 A1* | 10/2014 | Sato | ............ | G06F 1/1656 361/679.01 |
| 2015/0111426 A1 | 4/2015 | Buettner | | |
| 2015/0130775 A1* | 5/2015 | Kim | ............ | G06F 1/1652 345/82 |
| 2015/0201505 A1* | 7/2015 | Hu | ............ | H05K 5/0013 312/223.1 |
| 2016/0066450 A1* | 3/2016 | Morita | ............ | G06F 3/03547 361/679.01 |
| 2016/0295711 A1* | 10/2016 | Ryu | ............ | H01L 51/5237 |
| 2020/0007812 A1* | 1/2020 | Hino | ............ | H05K 7/14 |
| 2020/0076057 A1* | 3/2020 | Leutheuser | ............ | H05K 5/0217 |

FOREIGN PATENT DOCUMENTS

| | | |
|---|---|---|
| CN | 102348083 A | 2/2012 |
| CN | 102696285 A | 9/2012 |
| CN | 103765786 A | 4/2014 |
| CN | 203522900 U | 4/2014 |
| EP | 1643824 A2 | 4/2006 |
| JP | H05259926 A | 10/1993 |
| JP | H0794884 A | 4/1995 |
| JP | 2002135140 A | 5/2002 |
| JP | 2007-535109 | 11/2007 |
| JP | 2010-021494 | 1/2010 |
| JP | 2012-028996 | 2/2012 |
| JP | 2012039595 A | 2/2012 |
| WO | WO2013018608 | 2/2013 |

OTHER PUBLICATIONS

Written Opinion issued in International Patent Application No. PCT/JP2018/037337 dated Dec. 18, 2018 and English translation of same. 13 pages.

* cited by examiner

FIG. 7
A
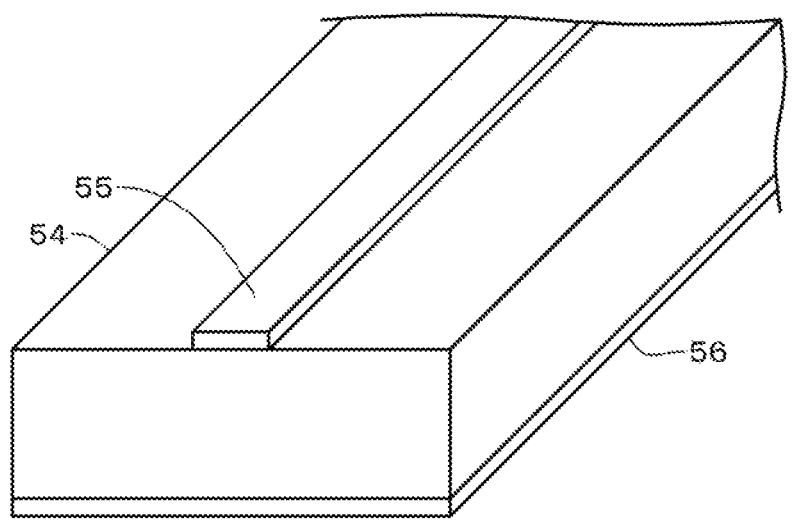
B
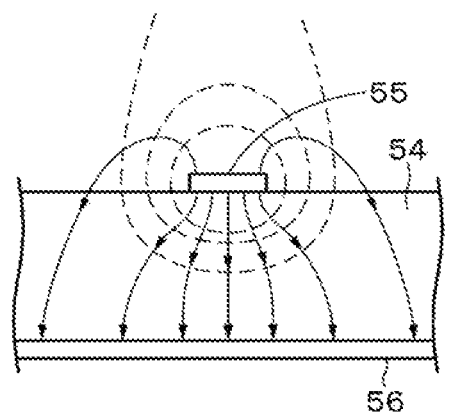

TUNER MODULE AND RECEIVING DEVICE

TECHNICAL FIELD

The present technology relates to a tuner module and a receiving device used for television broadcasting (terrestrial broadcasting, satellite broadcasting, cable television, etc.) reception.

BACKGROUND ART

Tuner modules each have a circuit board on which a circuit portion constituting at least part of a tuner is mounted, a metal shield case (referred to as a tuner case, as appropriate) housing the circuit board, and an antenna-signal input connector attached to the tuner case. One described in PTL 1 is proposed as one example of such tuner modules.

The tuner module described in PTL 1 has a configuration in which a ground terminal integrated with a tuner case is electrically connected with a circuit board via solder. The tuner module described in PTL 1 is to solve a problem that since the ground terminal, the circuit board, and the solder have mutually different thermal expansion coefficients in the configuration, the solder cracks, and the property in terms of contact between the ground terminal and the circuit board deteriorates. That is, since it is difficult, in terms of processing, to provide a penetrating hole for a through hole at an outer circumference section of the circuit board, the structure of the ground terminal is often used on the outer circumference of the tuner case.

CITATION LIST

Patent Literature

[PTL 1]
JP 2010-021494A

SUMMARY

Technical Problem

The configuration described in PTL 1 has a drawback in terms of insufficient strengths of joints since the ground terminal which is soldered does not penetrate a through hole of the circuit board. In addition, complicated processing methods such as coining have been required for maintaining the strengths of solder-joint points, and giving the solder-joint points flexibility against temperature. However, such necessitates different detail designing for different models depending on the overall shapes of tuners, the positions of ground terminals and the like, and becomes a cause of an increase of man-hours for designing.

Accordingly, an object of the present technology is to provide a tuner module that makes it possible to sufficiently ensure the strengths of joints between a ground terminal and a circuit board, to simplify processing methods, and to prevent an increase of man-hours for designing.

Solution to Problem

The present technology relates to a tuner module including an input connector, a tuner case, a circuit board, and an auxiliary piece. The auxiliary piece contacts a surface of the tuner case and is fixed to the surface of the tuner case, and part of the auxiliary piece is connected as a ground potential near a contact of a core wire of the input connector with the circuit board. In addition, the present technology relates to a receiving device having the tuner module.

Advantageous Effects of Invention

According to at least one embodiment, a direct current and a high-frequency resistance between grounds of an input connector, a nearby tuner case, and a circuit board can be made very small, and also joints between the tuner case and the circuit board can be made strong. Note that the effects described here are not necessarily the only effects, and effects that can be attained may include any effect described in the present technology and an effect which is different in kind from those effects. In addition, the effects illustrated as examples in the following explanation should not be interpreted as limitations on the content of the present technology.

BRIEF DESCRIPTION OF DRAWINGS

FIG. 7 includes FIG. 7A and FIG. 7B which are schematic diagrams used for explanation of the present technology.

DESCRIPTION OF EMBODIMENTS

Embodiments explained below are suitable specific examples of the present technology, and given various technologically preferable limitations. However, the scope of the present technology is not limited by the embodiments unless there are descriptions that limit the present technology in particular manners in the following explanation.

Note that the explanation of the present technology is given in accordance with the following order.
<1. First Embodiment of Present Technology>
<2. Second Embodiment of Present Technology>
<3. Third Embodiment of Present Technology>
<4. Application Example>
<5. Modification>

1. First Embodiment of Present Technology

Figure 1:
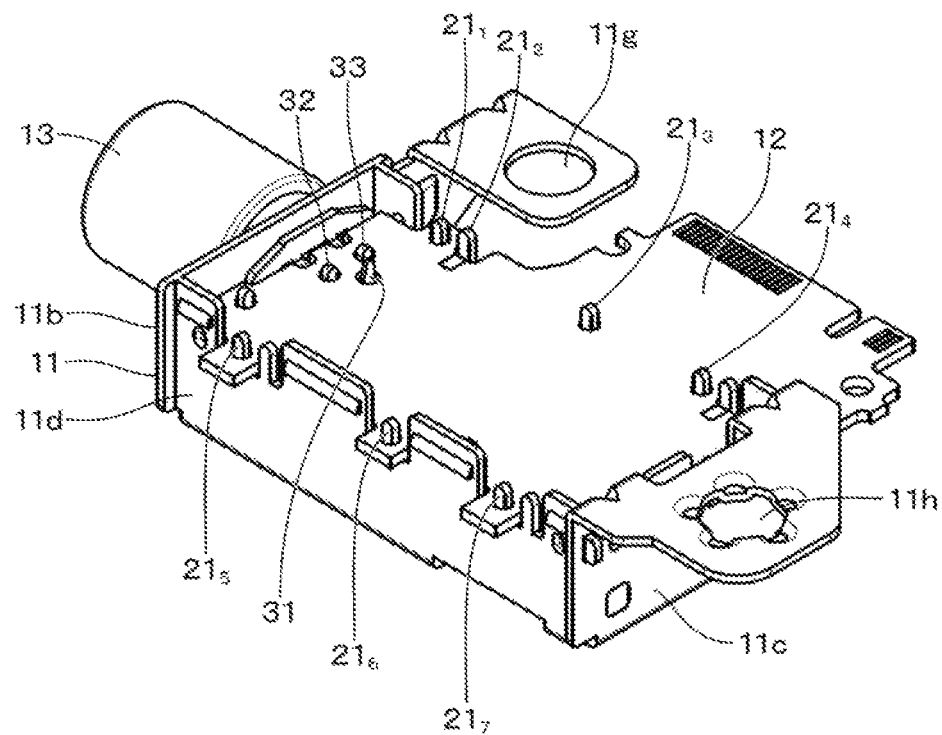
FIG. 1 is a perspective view of a first embodiment of the present technology.
Figure 2:
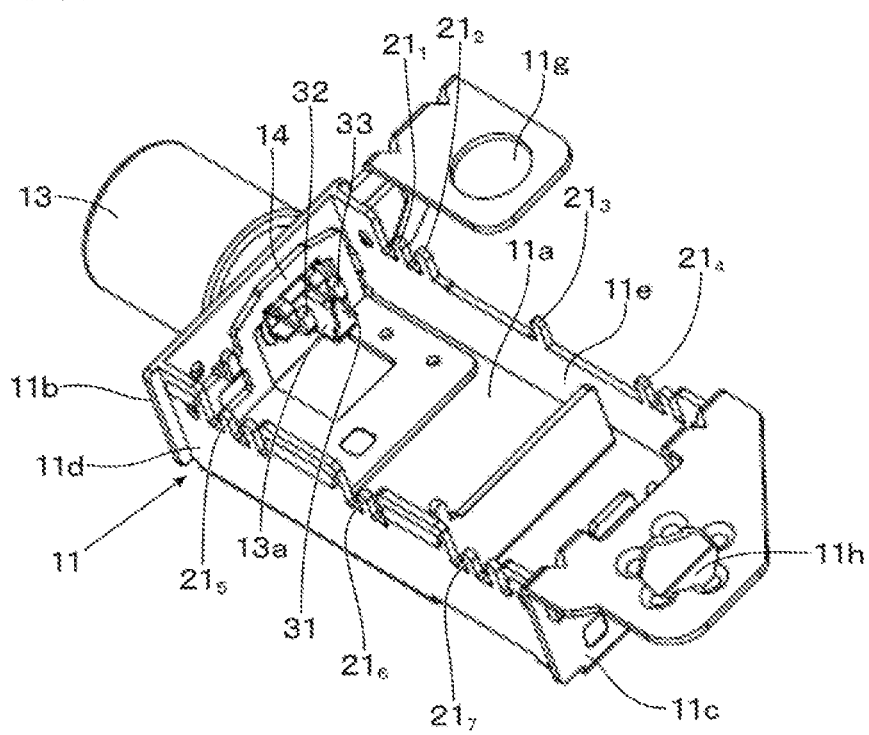
FIG. 2 is a perspective view of the first embodiment of the present technology.
Figure 3:
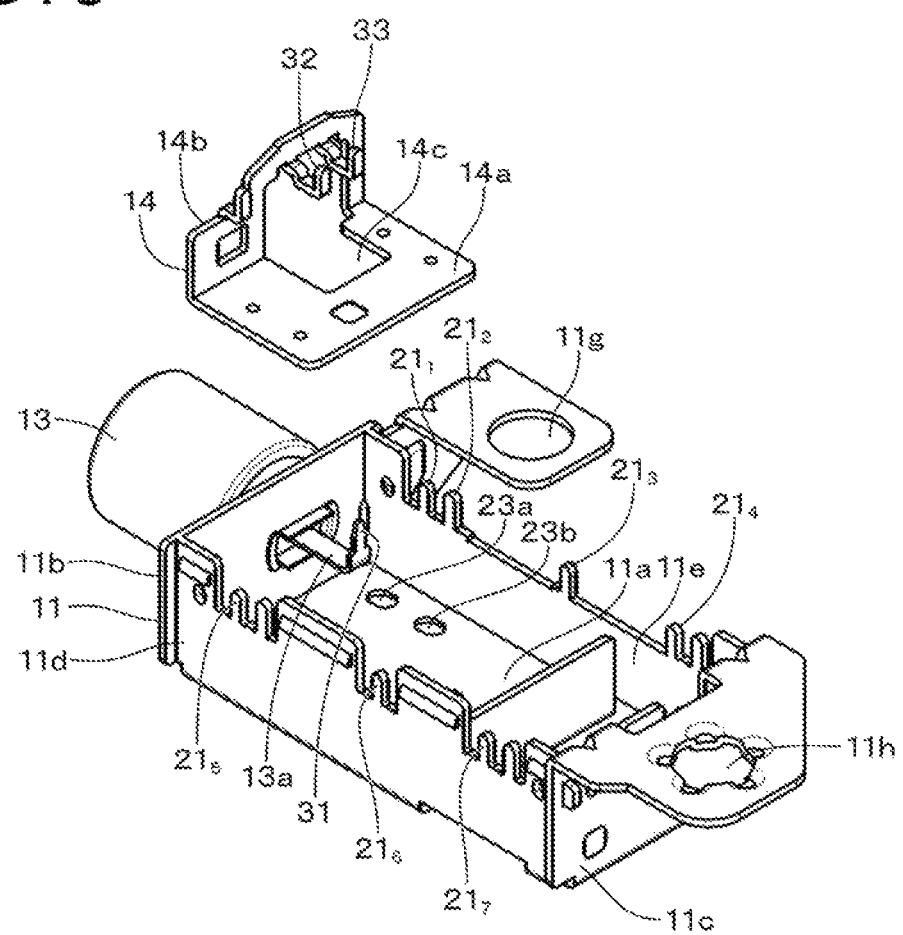
FIG. 3 is a perspective view of the first embodiment of the present technology.
Figure 4:
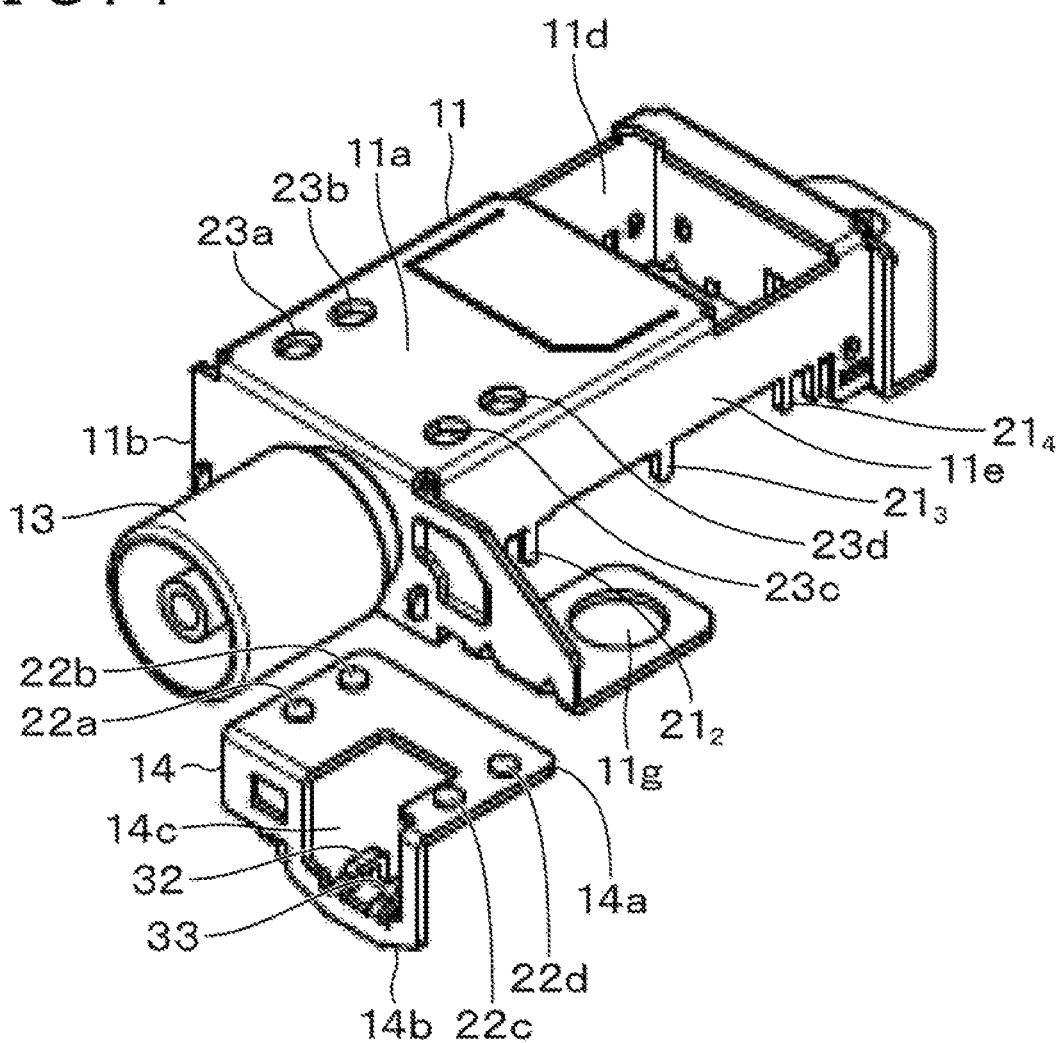
FIG. 4 is a perspective view of the first embodiment of the present technology.

Hereinafter, a first embodiment of a tuner module according to the present technology is explained with reference to the drawings. FIG. 1 is a perspective view illustrating a configuration example of the tuner module according to the first embodiment of the present technology. FIG. 2 is a perspective view of a state where a circuit board is removed. FIG. 3 is a perspective view of a state where the circuit board and an auxiliary piece are removed. FIG. 4 is a perspective view of a state where the circuit board and the auxiliary piece are removed, and the tuner module is turned upside down as compared to the one illustrated in FIG. 3.

The tuner module includes a tuner case 11, a circuit board 12, an input connector 13, and an auxiliary piece 14. On one surface or both surfaces of the circuit board 12, circuit components that constitute at least part of the tuner module are mounted. The tuner case 11 is a metallic case that functions as a shield case. Note that a lid (not illustrated) may cover part of or the entire surface of the circuit board 12. The lid includes a material similar to the material of the tuner case 11.

The tuner case 11 has a box shape including: a rectangular bottom-surface plate 11a; and a front-surface plate 11b, a back-surface plate 11c, a side-surface plate 11d, and a side-surface plate 11e that are raised from the front, back, left, and right edges of the bottom-surface plate 11a, respectively. The tuner case 11 has one open surface. In addition, hole sections 11g and 11h are screw holes for fixing the tuner module to the housing of a television receiver, for example. The circuit board 12 is attached so as to cover the open surface of the tuner case 11. An external conductor of the input connector 13 includes a metal such as iron, brass, or zinc. As one example, a base section of the external conductor of the input connector 13 is attached to the front-surface plate 11b of the tuner case 11 by non-screwing mechanical joining, screwing or the like.

The input connector 13 is a coaxial connector used for supplying an output of an antenna to a tuner, for example, and is an IEC (International Electrotechnical Commission) connector, for example. It should be noted, however, that the input connector 13 may have another configuration, and may be an F connector, for example. One type of F connectors is connected to one end of a coaxial cable, and is called an F connector plug or the like. Another type of F connectors is an F connector that receives the center conductor (hereinafter, referred to as the core wire) of a coaxial cable projecting from an F connector plug, and is called an F connector receptacle or the like.

The core wire of the coaxial cable inserted into the input connector 13 is pinched by two internal spring contact points (pinching pieces). The spring contact points constitute at least part of a center electrode, and a terminal section 13a connected with the center electrode is introduced from a rear section of the input connector 13 into the tuner case 11 through a hole formed through the front-surface plate 11b of the tuner case 11 (see FIG. 3).

A plurality of leg portions $21_1$, $21_2$, $21_3$, . . . , and $21_7$ (in a case that it is not necessary to distinguish between these leg portions, these are referred to as leg portions 21) projects upward from end surfaces of the side-surface plates of the tuner case 11. The leg portions 21 may penetrate holes formed through the circuit board 12. The inner walls of the penetrating holes have through-hole structures plated with copper foils on the circuit board 12, are connected with a ground terminal, and make the tuner case 11 serve as a uniform ground potential. In such a manner, joints can be formed around the entire circumferences of the through-hole holes of the circuit board 12 in which the leg portions 21 of the tuner case 11 are inscribed, and the mechanical strengths of the joints can be ensured. Note that all the leg portions projecting upward from the tuner case 11 are preferably joined with the holes formed through the circuit board 12.

The terminal section 13a of the input connector 13 is bent upward at an intermediate portion thereof, and the bent portion serves as a leg portion 31. The leg portion 31 may penetrate a hole formed through the circuit board 12. The hole has a configuration of a through hole, and serves as a signal terminal on the circuit board 12.

The auxiliary piece 14 is formed by bending a metal plate of a material similar to the material of the tuner case 11 into an L-shape, and has a base section 14a and a raised section 14b. Center portions of the base section 14a and the raised section 14b are clipped to form an opening 14c. The base section 14a of the auxiliary piece 14 is mechanically and electrically connected with the bottom-surface plate 11a of the tuner case 11. Note that both the base section 14a and the raised section 14b may be mechanically and electrically connected with the tuner case 11. The opening 14c is formed at a position similar to the position of the hole of the front-surface plate 11b, and the terminal section 13a is introduced into the tuner case 11 through the hole and the opening 14c. Methods that can be used for connection between the tuner case 11 and the auxiliary piece 14 include screwing, non-screwing mechanical joining, welding, soldering and the like.

The terminal section 13a is connected with the core wire of the coaxial cable connected to the input connector 13, and for suppression of radio waves radiated from the terminal section 13a, the length of the terminal section 13a is preferably short. On the other hand, since the leg portion 31 at the tip of the terminal section 13a may penetrate a through hole formed through the circuit board 12, it becomes difficult to form the through hole at an end section of the circuit board 12 if the length of the terminal section 13a is made short. Accordingly, the length of the terminal section 13a is made short only to the extent that the through hole can be formed at the end section of the circuit board 12.

Two leg portions 32 and 33 project parallel to each other inward from an upper section of the opening 14c of the raised section 14b of the auxiliary piece 14. The leg portions 32 and 33 have approximately similar shapes which are bent upward at intermediate portions thereof. As illustrated in FIG. 2, the leg portions 32 and 33 are arranged to be positioned near both sides of the leg portion 31 of the terminal section 13a. Accordingly, in a case that the leg portions 31, 32, and 33 are connected to the circuit board 12, the connection locations on the circuit board 12 may be positioned relatively close to each other. Thereby, occurrence of unnecessary radiation can be suppressed.

Since the leg portions 32 and 33 are connected with the tuner case 11, the leg portions 32 and 33 serve as ground terminals. In order to provide such ground terminals, in a possible case, the auxiliary piece 14 may not be used, but by sheet metal working, for example, an external conductor of the input connector 13 may be cut, and the cut portions may be raised. The method leads to more significant deterioration of the strength of the input connector 13, and there is a fear that when a load is applied to the input connector 13 by a coaxial cable connected to the input connector 13 at the time of actual use, the input connector 13 may be damaged. In addition, since a hole through which the core wire of the input connector 13 penetrates is provided, the leg portions are undesirably located closer to the input connector 13, it becomes necessary to form holes, through which the leg portions are to be inserted, near an end section of the circuit board 12, and there is a fear that the circuit board 12 may be damaged. Furthermore, the method of forming the leg portions by processing of cutting the tuner case 11 itself and raising the cut portions necessitates forming holes through the tuner case 11, and gives rise to a problem that radiation from the holes is caused.

In order to avoid such problems, the auxiliary piece 14 is used. The auxiliary piece 14 assists connection between the tuner case 11 and the circuit board 12 that serve as a ground potential. The base section 14a of the auxiliary piece 14 is in surface-contact with the bottom-surface plate 11a of the tuner case 11, thereby realizing a low contact resistance. In order to surely realize the surface-contact, as illustrated in FIG. 4, a plurality of protrusions 22a, 22b, 22c, and 22d projecting from the base section 14a is formed, and holes 23a, 23b, 23c, and 23d are formed at positions on the bottom-surface plate 11a that correspond to the protrusions 22a to 22d. The protrusions 22a to 22d fit to the holes 23a to 23d, thereby making it possible to surely realize the surface-contact.

In the first embodiment of the present technology mentioned above, all the ground connecting sections between the tuner case 11 and the circuit board 12 can be soldered connections around the entire circumferences of the through-hole hole sections. Accordingly, solder joints in which a direct current and a high-frequency resistance between grounds of the input connector, the nearby tuner case, and the circuit board can be made very small can be realized, and strong connections can be established. In addition, the intervals between the inner walls of the through holes and the inserted leg portions of the tuner case 11 are very narrow, and solder melted in a reflow oven experiences capillary action, and is drawn into the intervals, thereby making it possible to realize strong joints simply and conveniently.

For reference, conventional tuner-assembling steps are explained. A semifinished product of a tuner on which surface mount components are mounted on a circuit board is created. Typically, after solder before being melted is printed on the circuit board, the surface mount components are mounted in such a manner that the surface mount components come into contact with the solder printed by a robot machine having nozzles that suctionally attract the surface mount components, and the solder is melted by first heating by the reflow oven and joined with the surface mount components. Thereafter, a tuner case of the tuner is inserted into a slit section provided to the circuit board, and is joined by second heating by the reflow oven. The solder printing described above is a typical construction method (screen printing) of performing printing by using an aluminum screen of approximately 0.1 mm, and can fix many electronic components onto the circuit board while ensuring conduction therebetween.

Figure 5:
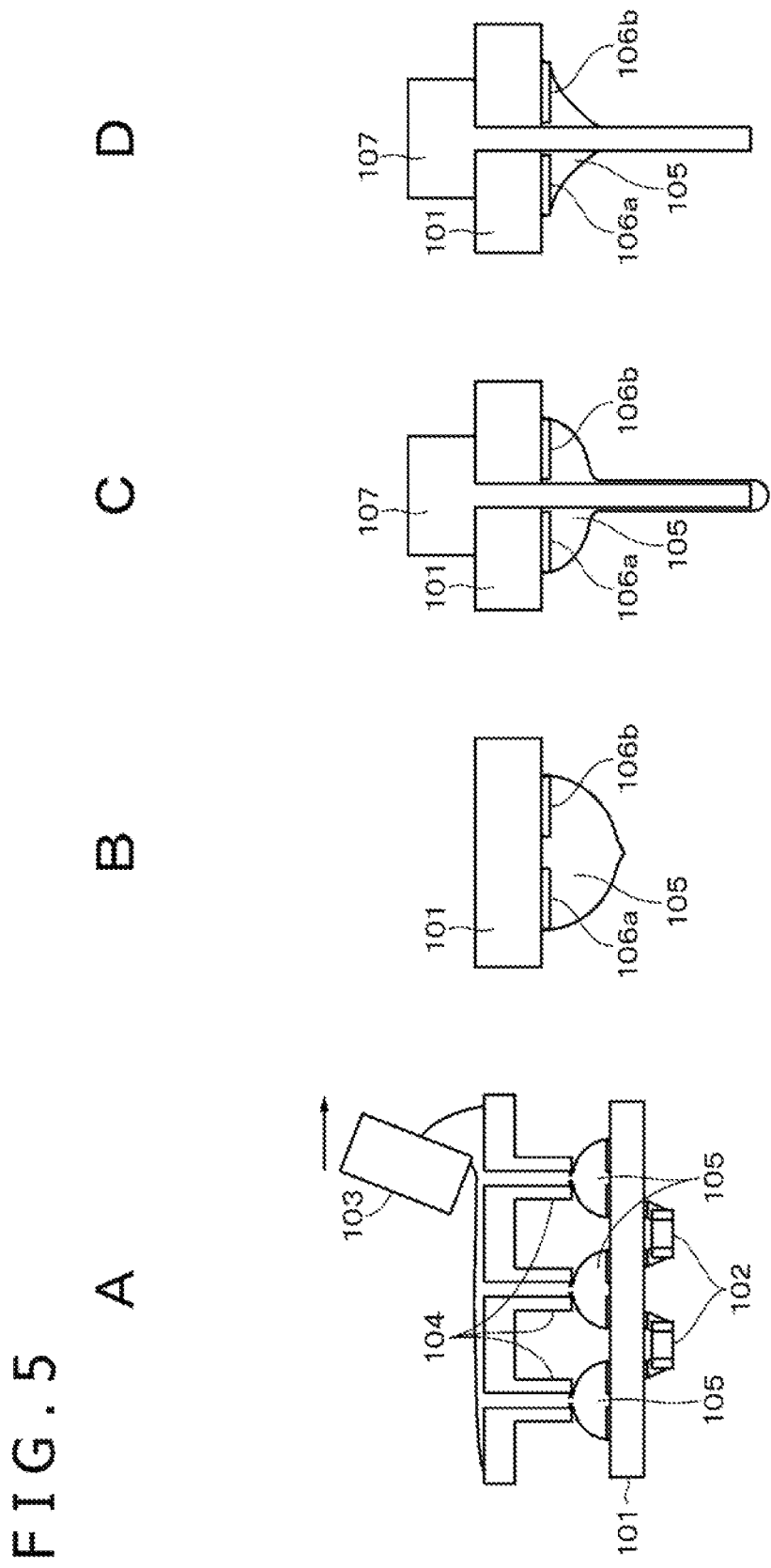
FIG. 5 includes FIG. 5A to FIG. 5D which are schematic diagrams used for explanation of conventional tuner-module assembling steps.

FIG. 5 is for explaining the second reflow process. First, as illustrated in FIG. 5A, a circuit board 101 is inverted before insertion of a tuner case, and on a side opposite to surface mount components 102, solder 105 pushed into nozzles 104 by a laterally-sliding squeegee 103 is applied onto the board 101 in accordance with the principle of what is called mimeograph printing (collective application of solder).

Next, as illustrated in FIG. 5B, while being careful not to allow the solder 105 before being melted to scatter or drip, the circuit board 101 is inverted again (board inversion). The reference signs 106a and 106b indicate copper foils. Then, as illustrated in FIG. 5C, a mechanical component 107 such as a tuner case is mounted, and as illustrated in FIG. 5D, the mechanical component 107 is joined by second reflowing.

In the conventional tuner manufacturing steps, the nozzles 104 need to be designed and manufactured as dedicated facilities optimized for individual tuners, and care is also required regarding the viscosity and granularity of the solder 105, before being cured, to be applied by being caused to pass through the nozzles 104. In addition, since heating by the reflow oven is performed at least twice during the steps, care is also required regarding heat stress on the surface mount components 102. These issues make it necessary to perform inspections regarding the degree of completion by performing inspection experiments after trial manufacture, trial manufacture tests, tests for checking the reliability, and the like, and place a significant burden in terms of know-how, technology, costs, and time.

On the other hand, according to the present technology, the method of applying solder to fill the through-hole holes can be performed by printing on a surface where the surface mount components 102 are mounted by application of a screen. Accordingly, it is possible to make the nozzles 104 unnecessary, and the problems mentioned above can be solved.

In the first embodiment of the present technology mentioned above, the portion near the input connector 13 serves as a portion where conversion is performed such that what is called high-frequency signals, such as UHF-band signals or IF signals for satellite broadcasting, flowing through a coaxial line is made to flow through a planar circuit on the circuit board 12. At such a portion, the change in the form of transmission paths, that is, release from a closed circuit in the coaxial line onto the board makes it more likely that the impedance of the high-frequency signals changes significantly. In view of this, for the characteristics impedance of 75Ω of typical coaxial lines, for the purpose of making the ground potentials of the points of conversion equal at the time of designing such that one line width of a double-sided board having a ground layer forms a 75-Ω microstrip line, the leg portions 32 and 33 are provided.

In the first embodiment of the present technology, high-frequency signals are supplied to a signal processing section (referred to as a planar circuit) on the circuit board 12 through the coaxial cable and the input connector 13. That is, signals are transmitted from the coaxial cable to the planar circuit. The point is examined.

Figure 6:
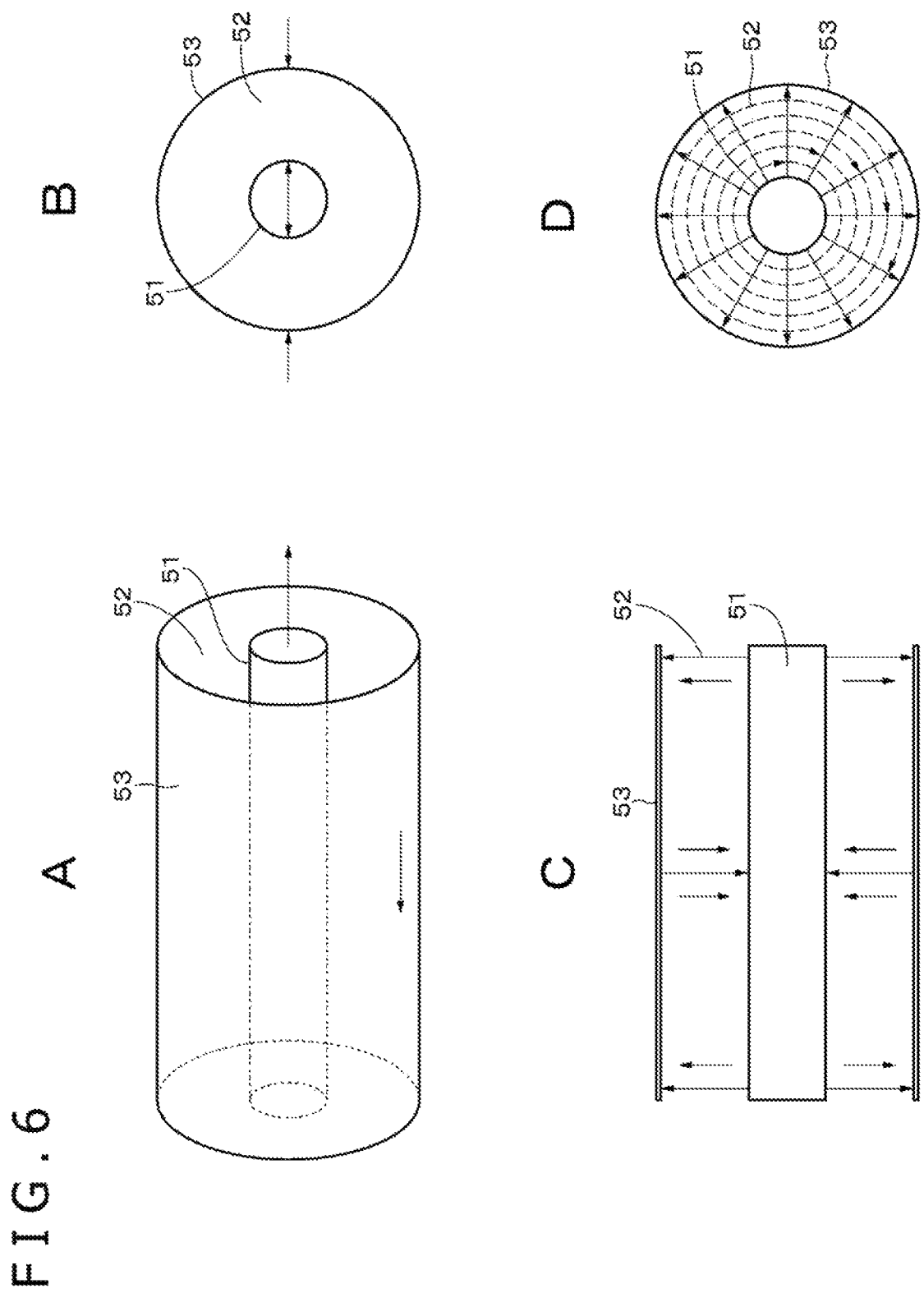
FIG. 6 includes FIG. 6A to FIG. 6D which are schematic diagrams used for explanation of the present technology.

As illustrated in FIG. 6, a coaxial cable has a center conductor (core wire) 51 and an external conductor 53 that covers the center conductor 51 with a dielectric 52 being interposed therebetween. The circumference of the external conductor 53 is covered by a protection cover (not illustrated). A current flows inside the center conductor 51 and the external conductor 53. A current from a signal source located at one end of the coaxial cable flows through the center conductor 51 to a load on the other end side, and furthermore passes through the external conductor 53 to return to the signal source on the one end side.

As illustrated in FIG. 6B, if the outer diameter of the center conductor 51 of the coaxial cable is defined as d, the inner diameter of the external conductor 53 is defined as D, and the dielectric constant of the dielectric 52 is ε the impedance Z of the coaxial cable is represented by the following formula.

$$Z = \frac{138}{\sqrt{\varepsilon}} \log \frac{D}{d} \quad \text{[Math. 1]}$$

As illustrated in FIG. 6C and FIG. 6D, in the coaxial cable, lines of electric force (indicated by arrows) are induced radially from the center conductor 51, and the lines of electric force and flux lines (dotted line) orthogonal to the lines of electric force form a transmission path and do not leak to the outside. On the other hand, FIG. 7A and FIG. 7B illustrate the configuration of a microstrip line in which a conductor line 55 is provided on one surface of a dielectric board 54, and a ground conductor surface 56 is provided on the other surface of the dielectric board 54. High-frequency signals are transmitted from a coaxial cable to a surface circuit represented by a microstrip line, and are converted into the shape of flux line and lines of electric force as illustrated in FIG. 7B.

As is apparent from FIG. 7B, radial lines of electric force in the coaxial cable are almost confined between the conductor line 55 and the ground conductor surface 56 that are located above and below each other. During the process of conversion, almost half of the radial lines of electric force are not transmitted. Radiation of high-frequency signals can be prevented, and also less attenuated transmission of the high-frequency signals becomes possible by arranging what is called a conductor line and a grounded portion such that the distance therebetween becomes short. When the input connector 13 is connected to the circuit board 12, it is also necessary to adopt the conditions mentioned above, and desired results have conventionally been realized by knowhow acquired through cut-and-try.

In recent years, the performance of personal computers has been enhanced, and the computational capability has improved significantly. Thereby, simulations of such discontinuous points have become possible. It can be known that, for efficient transmission to the surface circuit, rather than modifying the shape of a connector, it is effective to make a connection of the grounded section with the board sufficiently large, and also make narrow the gap between the conductor line and the grounded section disposed on the same layer. Qualitatively, signals that are undesirably radiated at discontinuous portions become part of losses.

In the present technology, the portion near the connector connecting section is designed in according with the basic theory mentioned above, and it is found that a connection with a ground potential established by the auxiliary piece 14 is the most effective connection.

2. Second Embodiment of Present Technology

Figure 8:
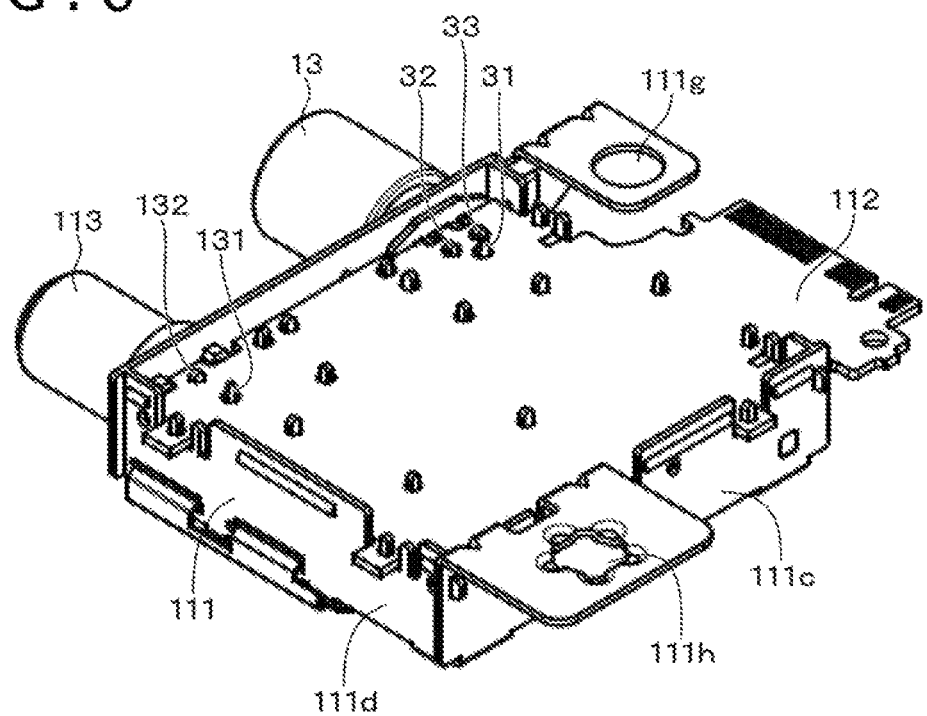
FIG. 8 is a perspective view of a second embodiment of the present technology.
Figure 9:
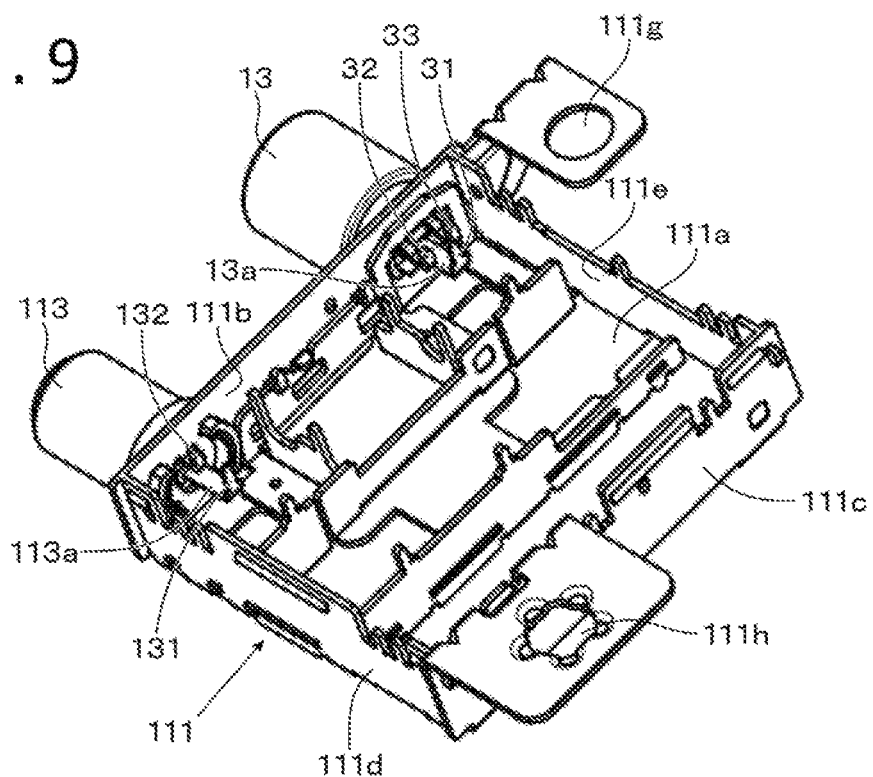
FIG. 9 is a perspective view of the second embodiment of the present technology.
Figure 10:
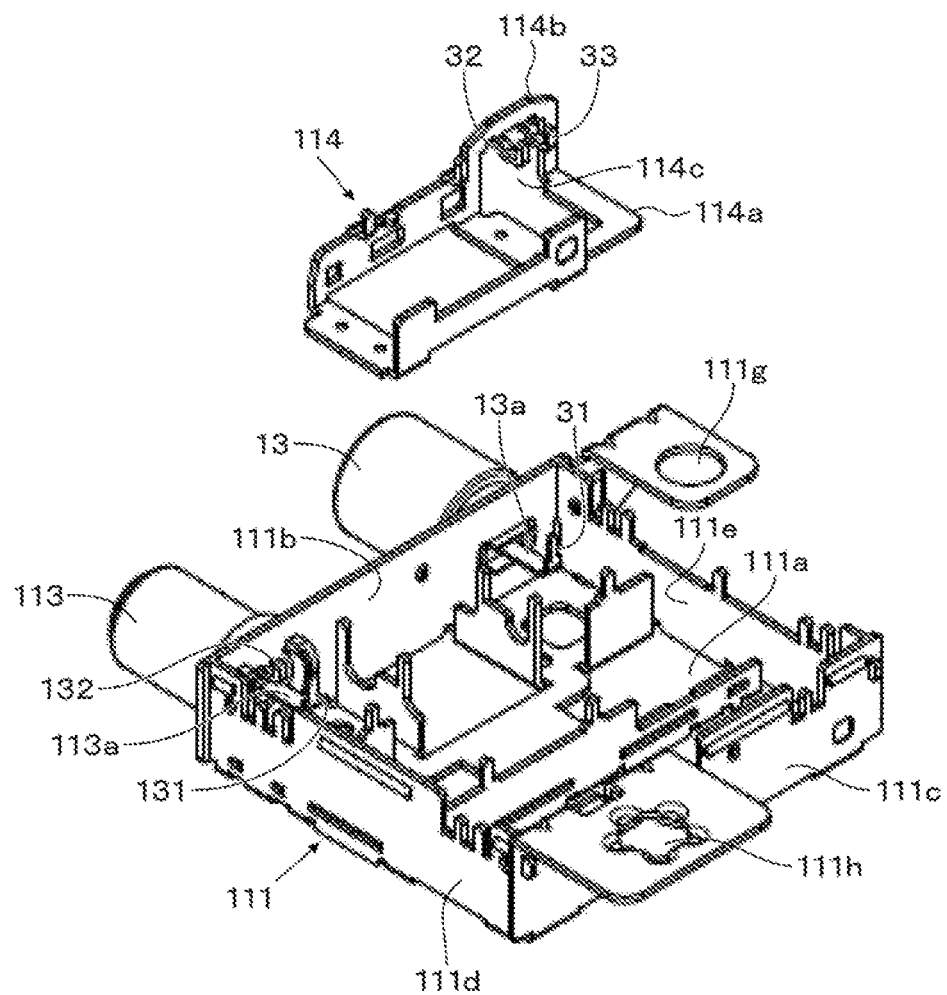
FIG. 10 is a perspective view of the second embodiment of the present technology.

Next, a second embodiment of a tuner module according to the present technology is explained. FIG. 8 is a perspective view illustrating a configuration example of the tuner module according to the second embodiment of the present technology. FIG. 9 is a perspective view of a state where a circuit board is removed. FIG. 10 is a perspective view of a state where the circuit board and an auxiliary piece are removed.

The second embodiment adopts a biaxial configuration obtained by adding an input connector 113 to the configuration of the first embodiment. For example, digital terrestrial broadcasting reception signals are supplied to the input connector 13, and satellite broadcasting IF signals are supplied to the input connector 113. The tuner module includes a tuner case 111, a circuit board 112, the input connectors 13 and 113, and an auxiliary piece 114. On one surface or both surfaces of the circuit board 112, circuit components that constitute at least part of the tuner module are mounted. The tuner case 111 is a metallic case that functions as a shield case. Note that a lid (not illustrated) may cover part of or the entire surface of the circuit board 112. The lid includes a material similar to the material of the tuner case 111.

The tuner case 111 has a box shape including: a rectangular bottom-surface plate 111a; and a front-surface plate 111b, a back-surface plate 111c, a side-surface plate 111d, and a side-surface plate 111e that are raised from the front, back, left, and right edges of the bottom-surface plate 111a, respectively. The tuner case 111 has one open surface. In addition, hole sections 111g and 111h are screw holes for fixing the tuner module to the housing of a television receiver, for example. The circuit board 112 is attached so as to cover the open surface of the tuner case 111. External conductors of the input connectors 13 and 113 include a metal such as iron, brass, or zinc. Base sections of the external conductors of the input connectors 13 and 113 are attached to the front-surface plate 111b of the tuner case 111 by non-screwing mechanical joining, screwing or the like.

The input connectors 13 and 113 are coaxial connectors used for supplying outputs of antennas to a tuner, for example. The input connector 113 is an F connector, for example. It should be noted, however, that, similarly to the input connector 13, the input connector 113 may be an IEC connector.

The core wires of coaxial cables inserted into the input connectors 13 and 113 are each pinched by two internal spring contact points (pinching pieces). The spring contact points constitute at least part of center electrodes, and terminal sections 13a and 113a connected with the center electrodes are introduced from rear sections of the input connectors 13 and 113 into the tuner case 111 through holes formed on the front-surface plate 111b of the tuner case 111 (see FIG. 10).

A plurality of leg portions projects upward from end surfaces of the side-surface plates 111d and 111e and the back-surface plate 111c of the tuner case 111. Furthermore, a plurality of plate-like bodies is provided on the bottom-surface plate 111a of the tuner case 111, and leg portions are provided on the upper end surfaces of the plurality of plate-like bodies. The leg portions are inserted into through holes provided as ground terminals of the circuit board 112, and soldered. Some of the plurality of plate-like bodies are provided to surround areas of corner sections of the tuner case 111 where the respective input connectors 13 and 113 are provided. The plate-like bodies include a metal similar to the metal of the tuner case 111, and function as shield members. Note that the auxiliary piece 114 may integrally have plate-like bodies that have similar functions.

In such a manner, the leg portions may penetrate holes formed through the circuit board 112. The inner walls of the penetrating holes have through-hole structures plated with copper foils on the circuit board 112, are connected with a ground terminal, and make the tuner case 111 serve as a uniform ground potential. In such a manner, joints can be formed around the entire circumferences of the through-hole holes of the circuit board 112 in which the leg portions of the tuner case 111 are inscribed, and the mechanical strengths of the joints can be ensured. Note that all the leg portions projecting upward from the tuner case 111 are preferably joined with the holes formed through the circuit board 112.

The terminal section 13a of the input connector 13 and the terminal section 113a of the input connector 113 are bent upward at intermediate portions thereof, and the bent portions serve as leg portions 31 and 131, respectively. The leg portions 31 and 131 may penetrate holes formed through the circuit board 112. The holes have configurations of through holes, and serve as signal terminals on the circuit board 112.

The auxiliary piece 114 is formed by bending a metal plate of a material similar to the material of the tuner case 111 into an L-shape, and has a base section 114a and a raised section 114b. Center portions of the base section 114a and the raised section 114b are clipped to form an opening 114c. The base section 114a of the auxiliary piece 114 is mechanically and electrically connected with the bottom-surface plate 111a of the tuner case 11. Note that both the base section 114a and the raised section 114b may be mechanically and electrically connected with the tuner case 111. The opening 114c is formed at a position similar to the position of the hole of the front-surface plate 111b, and the terminal section 13a is introduced into the tuner case 111 through the hole and the opening 114c. Methods that can be used for connection between the tuner case 111 and the auxiliary piece 114 include screwing, non-screwing mechanical joining, welding, soldering and the like.

The terminal section 13a is connected with the core wire of the coaxial cable connected to the connector 13, and for suppression of radio waves radiated from the terminal section 13a, the length of the terminal section 13a is preferably short. On the other hand, since the leg portion 31 at the tip of the terminal section 13a may penetrate a through hole formed through the circuit board 112, it becomes difficult to form the through hole at an end section of the circuit board 112 if the length of the terminal section 13a is made short. Accordingly, the length of the terminal section 13a is made short only to the extent that the through hole can be formed at the end section of the circuit board 112.

Two leg portions 32 and 33 project parallel to each other inward from an upper section of the opening 114c of the raised section 114b of the auxiliary piece 114. The leg portions 32 and 33 have approximately similar shapes which are bent upward at intermediate portions thereof. As illustrated in FIG. 10, the leg portions 32 and 33 are arranged to be positioned near both sides of the leg portion 31 of the terminal section 13a. Accordingly, in a case that the leg portions 31, 32, and 33 are connected to the circuit board 112, the connection locations on the circuit board 112 may be positioned relatively close to each other. Thereby, occurrence of unnecessary radiation can be suppressed.

Since the leg portions 32 and 33 are connected with the tuner case 111, the leg portions 32 and 33 serve as ground terminals. In order to provide such ground terminals, in a possible case, the auxiliary piece 114 may not be used, but by sheet metal working, for example, an external conductor of the input connector 13 may be cut, and the cut portions may be raised. The method leads to more significant deterioration of the strength of the input connector 13, and there is a fear that when a load is applied to the input connector 13 by a coaxial cable connected to the input connector 13 at the time of actual use, the input connector 13 may be damaged. In addition, the leg portions connected with the core wire of the input connector 13 are undesirably located closer to the input connector 13, and there is a fear that when holes through which the leg portions are to be inserted are formed near an end section of the circuit board 112, the circuit board 112 may be damaged. Furthermore, the method of forming the leg portions by processing of cutting the tuner case 111 itself and raising the cut portions necessitates forming holes through the tuner case 111, and gives rise to a problem that radiation from the holes is caused.

In order to avoid such problems, the auxiliary piece 114 is used. The auxiliary piece 114 assists connection between the tuner case 111 and the circuit board 112 that serve as a ground potential. The base section 114a of the auxiliary piece 114 is in surface-contact with the bottom-surface plate 111a of the tuner case 111, thereby realizing a low contact resistance. Similarly to the first embodiment, in the second embodiment, solder joints in which a direct current and a high-frequency resistance between grounds of the input connector, the nearby tuner case, and the circuit board can be made very small can also be realized, and strong connections can be established. Note that a leg portion 132 for connection with the ground terminals is provided near the terminal section 113a of the input connector 113.

3. Third Embodiment of Present Technology

Figure 11:
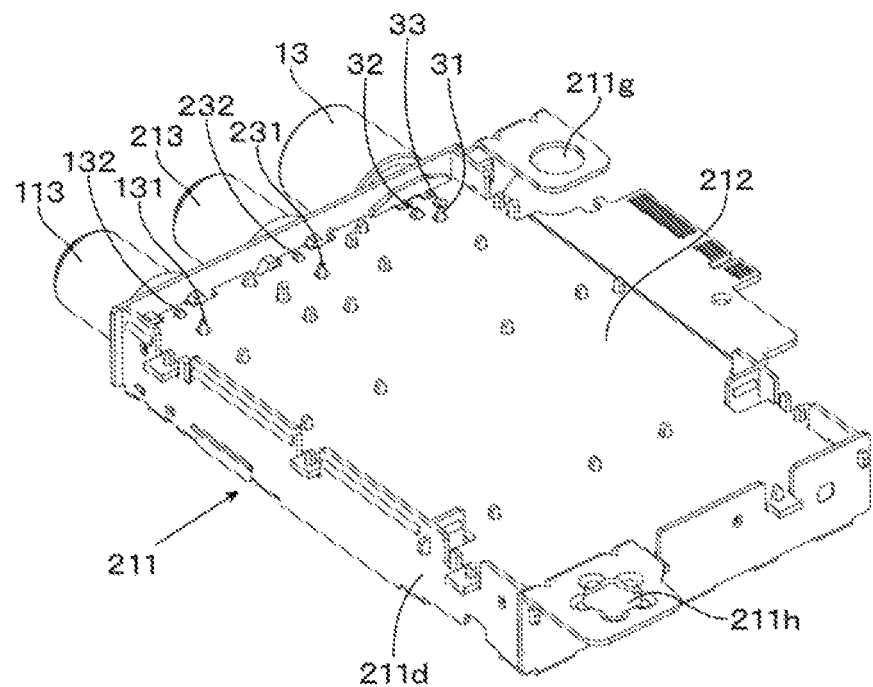
FIG. 11 is a perspective view of a third embodiment of the present technology.
Figure 12:
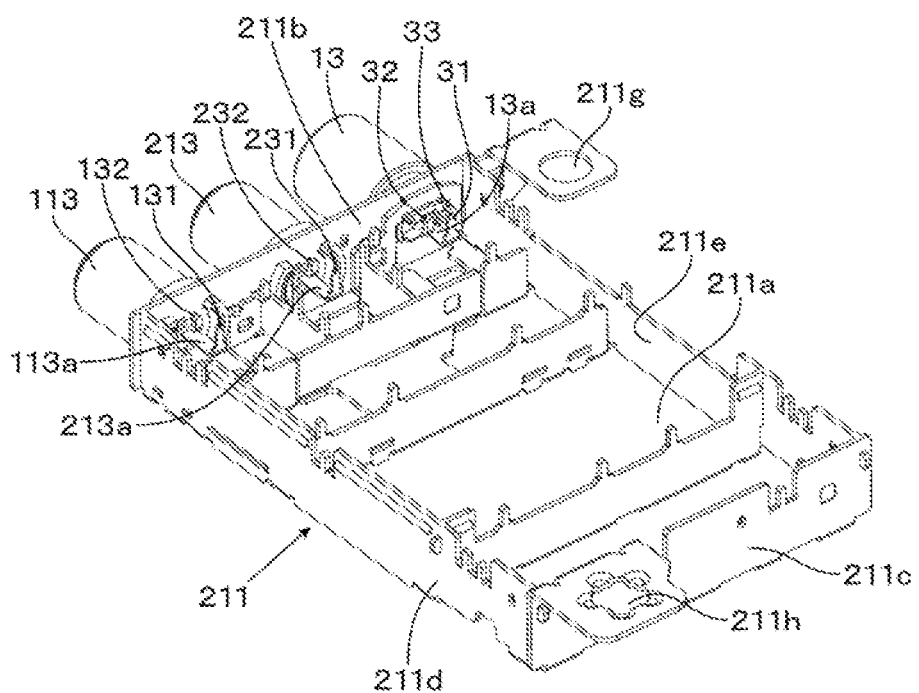
FIG. 12 is a perspective view of the third embodiment of the present technology.
Figure 13:
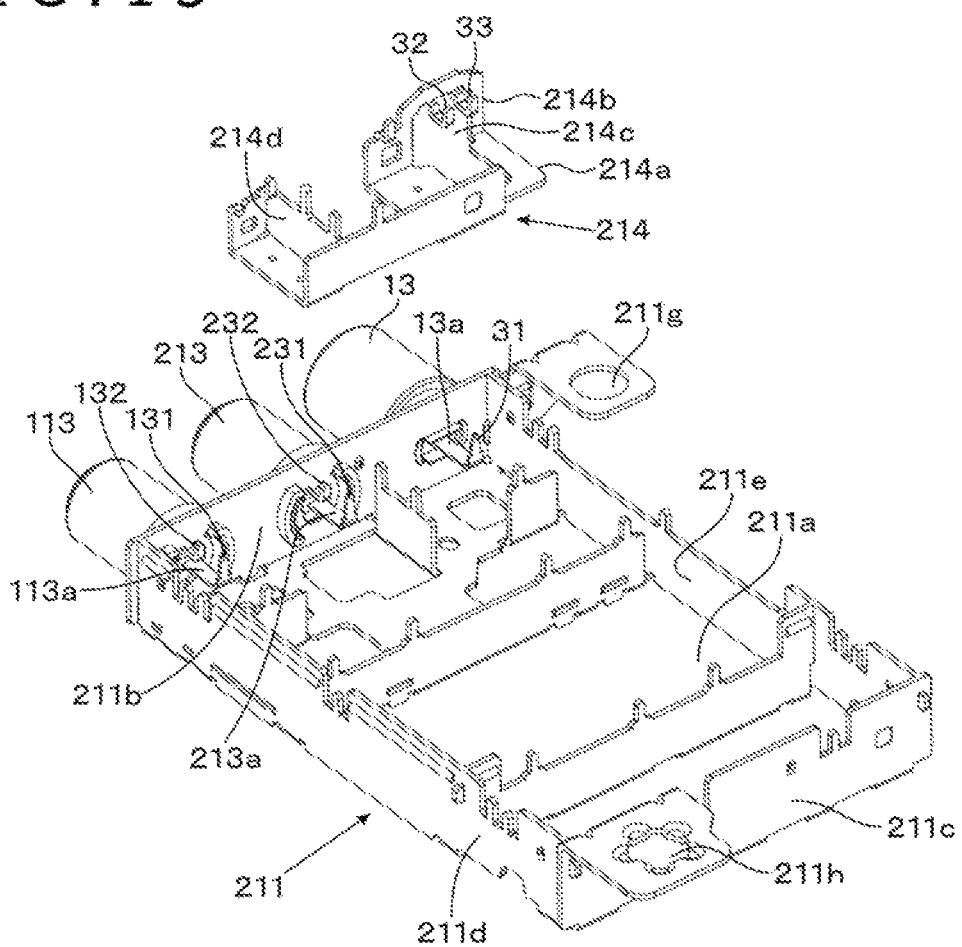
FIG. 13 is a perspective view of the third embodiment of the present technology.

Next, a third embodiment of a tuner module according to the present technology is explained. FIG. 11 is a perspective view illustrating a configuration example of the tuner module according to the third embodiment of the present technology. FIG. 12 is a perspective view of a state where a circuit board is removed. FIG. 13 is a perspective view of a state where the circuit board and an auxiliary piece are removed.

The third embodiment adopts a triaxial configuration obtained by adding an input connector 213 between the input connector 13 and the input connector 113 in the configuration in the second embodiment. For example, digital terrestrial broadcasting reception signals are supplied to the input connector 13, and satellite broadcasting IF signals are supplied to the input connectors 113 and 213. The tuner module includes a tuner case 211, a circuit board 212, the input connectors 13, 113, and 213, and an auxiliary piece 214. On one surface or both surfaces of the circuit board 212, circuit components that constitute at least part of the tuner module are mounted. The tuner case 211 is a metallic case that functions as a shield case. Note that a lid (not illustrated) may cover part of or the entire surface of the circuit board 212. The lid includes a material similar to the material of the tuner case 211.

The tuner case 211 has a box shape including: a rectangular bottom-surface plate 211a; and a front-surface plate 211b, a back-surface plate 211c, a side-surface plate 211d, and a side-surface plate 211e that are raised from the front, back, left, and right edges of the bottom-surface plate 211a, respectively. The tuner case 211 has one open surface. In addition, hole sections 211g and 211h are screw holes for fixing the tuner module to the housing of a television receiver, for example. The circuit board 212 is attached so as to cover the open surface of the tuner case 211. External conductors of the input connectors 13, 113, and 213 include a metal such as iron, brass, or zinc. Base sections of the external conductors of the input connectors 13, 113, and 213 are attached to the front-surface plate 211b of the tuner case 211 by non-screwing mechanical joining, screwing or the like.

The input connectors 13, 113, and 213 are coaxial connectors used for supplying outputs of antennas to a tuner, for example. The input connectors 113 and 213 are F connectors, for example. It should be noted, however, that, similarly to the input connector 13, the input connectors 113 and 213 may be IEC connectors.

The core wires of coaxial cables inserted into the input connectors 13, 113, and 213 are each pinched by two internal spring contact points (pinching pieces). The spring contact points constitute at least part of center electrodes, and terminal sections 13a, 113a, and 213a connected with the center electrodes are introduced from rear sections of the input connectors 13, 113, and 213 into the tuner case 211 through holes formed on the front-surface plate 211b of the tuner case 211 (see FIG. 12).

A plurality of leg portions projects upward from end surfaces of the side-surface plates 211d and 211e and the back-surface plate 211c of the tuner case 211. Furthermore, a plurality of plate-like bodies is provided on the bottom-surface plate 211a of the tuner case 211, and a plate-like body 214d is provided on the auxiliary piece 214 mentioned below. Leg portions are provided on the upper end surfaces of the plate-like bodies. The leg portions are inserted into through holes provided as ground terminals of the circuit board 112, and soldered. Some of the plurality of plate-like bodies are provided to surround areas of the tuner case 211 where the respective input connectors 13, 113, and 213 are provided. The plate-like bodies include a metal similar to the metal of the tuner case 211, and function as shield members.

In such a manner, the leg portions may penetrate holes formed through the circuit board 212. The inner walls of the penetrating holes have through-hole structures plated with copper foils on the circuit board 212, are connected with a ground terminal, and make the tuner case 211 serve as a uniform ground potential. In such a manner, joints can be formed around the entire circumferences of the through-hole holes of the circuit board 212 in which the leg portions of the tuner case 211 are inscribed, and the mechanical strengths of the joints can be ensured. Note that all the leg portions projecting upward from the tuner case 211 are preferably joined with the holes formed through the circuit board 212.

The terminal section 13a of the input connector 13, the terminal section 113a of the input connector 113, and the terminal section 213a of the input connector 213 are bent upward at intermediate portions thereof, and the bent portions serve as leg portions 31, 131, and 231, respectively. The leg portions 31, 131, and 231 may penetrate holes formed through the circuit board 212. The holes have configurations of through holes, and serve as signal terminals on the circuit board 212.

The auxiliary piece 214 is formed by bending a metal plate of a material similar to the material of the tuner case 211 into an L-shape, and has a base section 214a and a raised section 214b. Center portions of the base section 214a and the raised section 214b are clipped to form an opening 214c. In addition, the auxiliary piece 214 has the plate-like body 214d as a shield member between the input connectors 113 and 213. The base section 214a of the auxiliary piece 214 is mechanically and electrically connected with the bottom-surface plate 211a of the tuner case 211. Note that both the base section 214a and the raised section 214b may be mechanically and electrically connected with the tuner case 211. The opening 214c is formed at a position similar to the position of the hole of the front-surface plate 211b, and the terminal section 13a is introduced into the tuner case 211 through the hole and the opening 214c. Methods that can be used for connection between the tuner case 211 and the auxiliary piece 214 include screwing, non-screwing mechanical joining, welding, soldering and the like.

The terminal section 213a is connected with the core wire of the coaxial cable connected to the input connector 213, and for suppression of radio waves radiated from the terminal section 213a, the length of the terminal section 213a is preferably short. On the other hand, since the leg portion 231 at the tip of the terminal section 213a may penetrate a through hole formed through the circuit board 212, it becomes difficult to form the through hole at an end section of the circuit board 212 if the length of the terminal section 213a is made short. Accordingly, the length of the terminal section 213a is made short only to the extent that the through hole can be formed at the end section of the circuit board 212.

Two leg portions 32 and 33 project parallel to each other inward from an upper section of the opening 214c of the raised section 214b of the auxiliary piece 214. The leg portions 32 and 33 have approximately similar shapes which are bent upward at intermediate portions thereof. As illustrated in FIG. 12, the leg portions 32 and 33 are arranged to be positioned near both sides of the leg portion 31 of the terminal section 213a. Accordingly, in a case that the leg portions 31, 32, and 33 are connected to the circuit board 212, the connection locations on the circuit board 212 may be positioned relatively close to each other. Thereby, occurrence of unnecessary radiation can be suppressed.

Since the leg portions 32 and 33 are connected with the tuner case 211, the leg portions 32 and 33 serve as ground terminals. In order to provide such ground terminals, in a possible case, the auxiliary piece 214 may not be used, but by sheet metal working, for example, an external conductor of the input connector 13 may be cut, and the cut portions may be raised. The method leads to more significant deterioration of the strength of the input connector 13, and there is a fear that when a load is applied to the input connector 13 by a coaxial cable connected to the input connector 13 at the time of actual use, the input connector 13 may be damaged. In addition, the leg portions connected with the core wire of the input connector 13 are undesirably located closer to the input connector 13, and there is a fear that when holes through which the leg portions are to be inserted are formed near an end section of the circuit board 212, the circuit board 212 may be damaged. Furthermore, the method of forming the leg portions by processing of cutting the tuner case 211 itself and raising the cut portions necessitates forming holes through the tuner case 211, and gives rise to a problem that radiation from the holes is caused.

In order to avoid such problems, the auxiliary piece 214 is used. The auxiliary piece 214 assists connection between the tuner case 211 and the circuit board 212 that serve as a ground potential. The base section 214a of the auxiliary piece 214 is in surface-contact with the bottom-surface plate 211a of the tuner case 211, thereby realizing a low contact resistance. Note that leg portions 132 and 232 for connection with the ground terminals are provided near the terminal sections 113a and 213a of the input connectors 113 and 213, respectively.

In the present technology mentioned above, all the ground connecting sections between the tuner case 211 and the circuit board 212 can be soldered connections around the entire circumferences of the through-hole hole sections. Accordingly, solder joints in which a direct current and a high-frequency resistance between grounds of the input connector, the nearby tuner case, and the circuit board can be made very small can be realized. The present technology is suitable for tuner modules of advanced BS receiving devices (to be put on the market as 4K and 8K television television) that receive the frequency range that covers 3.2 GHz as a result of the future expansion of the reception band. In addition, the intervals between the inner walls of the through holes and the inserted leg portions of the tuner case 211 are very narrow, and solder melted in a reflow oven experiences capillary action and is drawn into the intervals, thereby making it possible to realize strong joints simply and conveniently.

Furthermore, as is apparent from the examples in the second and third embodiments, if a shield wall is installed by cutting and raising for the purpose of improving isolation between input connectors, the number of opening sections of a tuner case increases. This makes it more likely that leakage of signals and outputs of a local transmitter to the outside of a tuner module occurs. As a countermeasure against this, the auxiliary piece is arranged to block the opening sections of the tuner case. Thereby, the effect of improving connection of the ground pattern and the effect of reducing unnecessary radiation can be attained.

On the other hand, the use of collective application of solder by means of nozzles can be avoided, and manufacturing steps by simple and convenient solder printing by means of an aluminum screen can be adopted. Accordingly, for example, dedicated nozzles that are prepared for manufacture of uniaxial tuners and triaxial tuners having different solder connection points become unnecessary, and therefore technology and know-how necessary for the manufacturing steps become unnecessary. Then, since special facilities necessary for collective application of solder also become unnecessary, a launch, transfer, or change of a manufacture factory also becomes easy, and accordingly a huge cost-reduction effect can be expected in terms of business. Furthermore, elimination of reflow steps by collective application of solder leads to reduction of the number of times of heat stress on components to be used for modules, and contributes to enhancement of the reliability of the components. That is, this is because deterioration of molds and the like is slowed since the number of times of heating at the time of reflow decreases.

Figure 14:
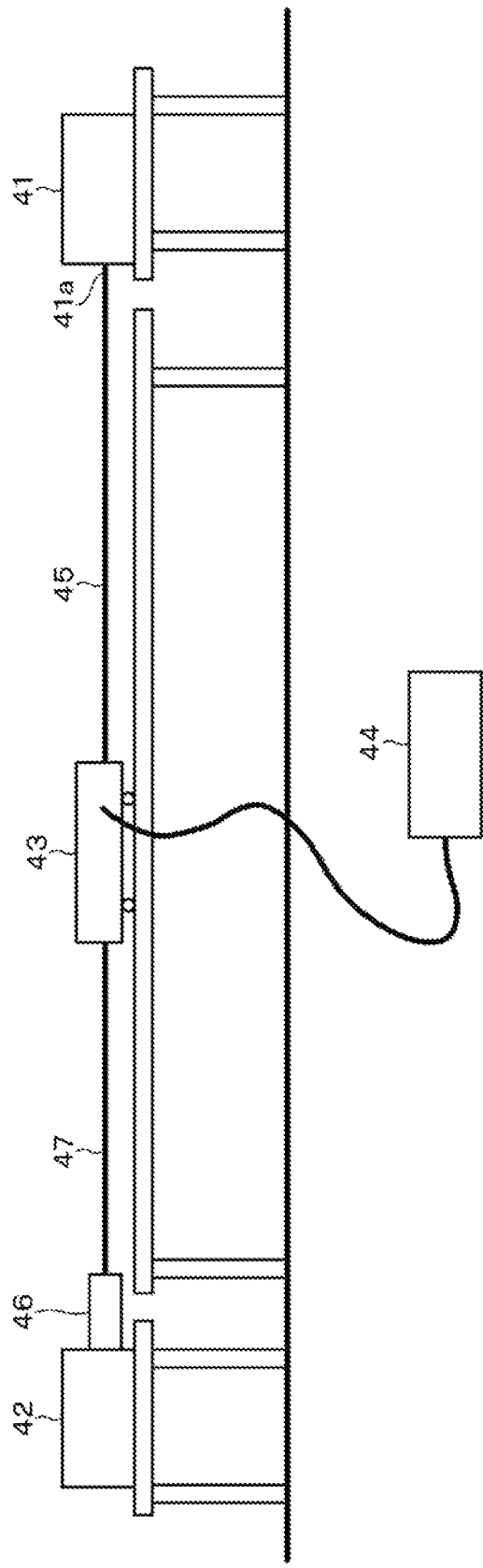
FIG. 14 is a schematic diagram illustrating a configuration for measuring the effects of the present technology.
Figure 15:
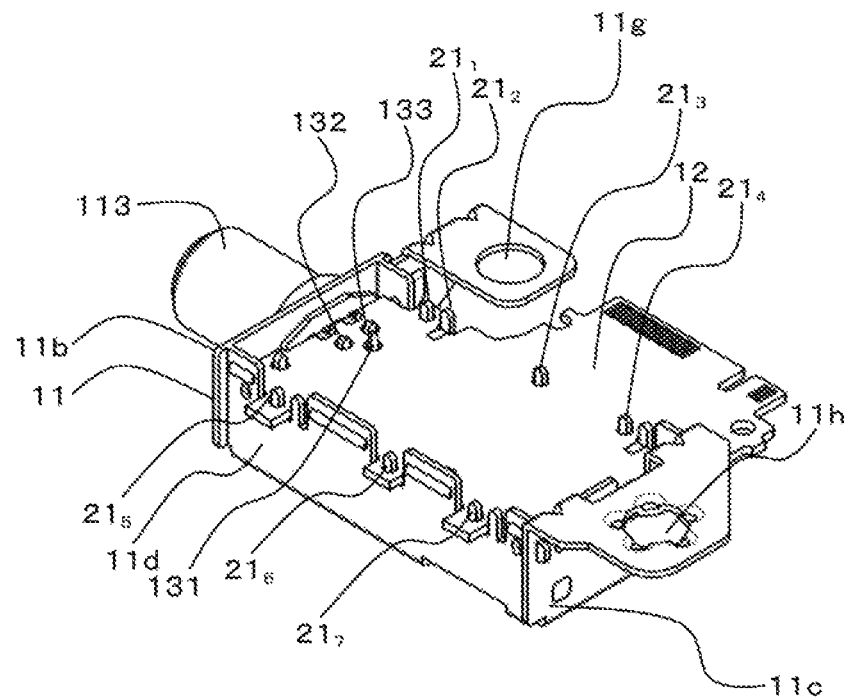
FIG. 15 is a perspective view of a modification of the present technology.
Figure 16:
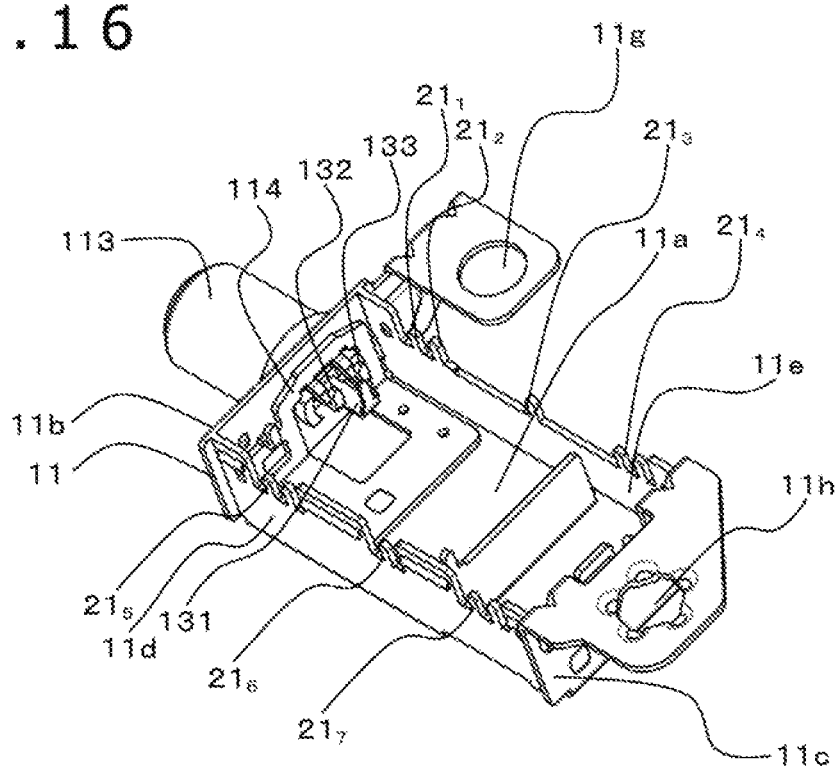
FIG. 16 is a perspective view of the modification of the present technology.
Figure 17:
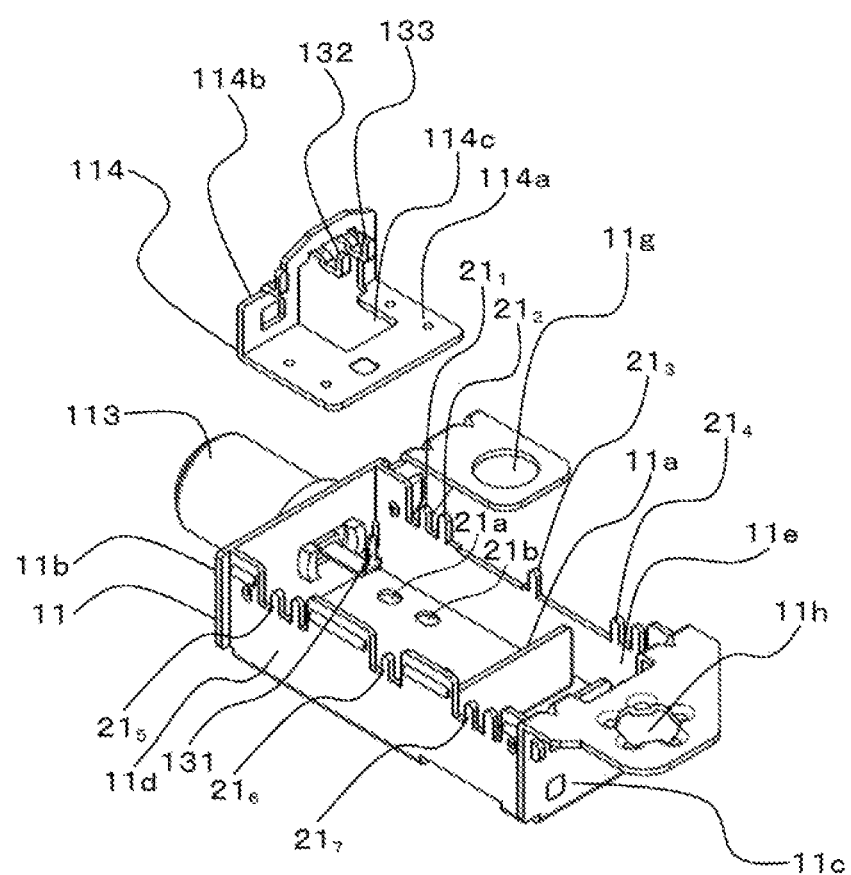
FIG. 17 is a perspective view of the modification of the present technology.
Figure 18:
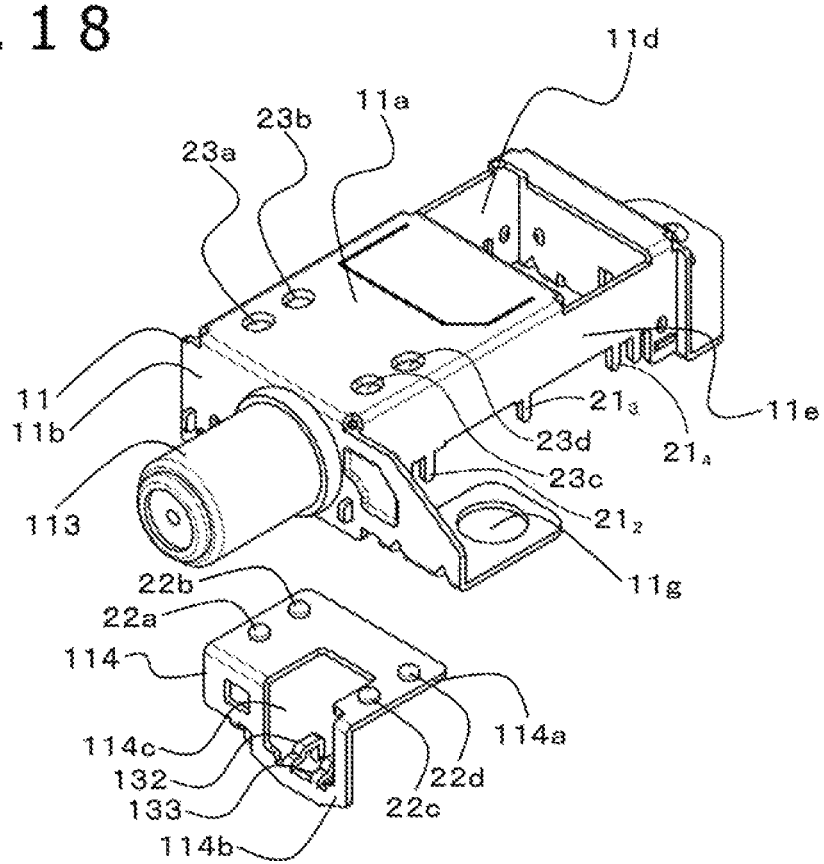
FIG. 18 is a perspective view of the modification of the present technology.

FIG. 14 illustrates one example of a device for measuring the effects of the present technology. That is, the configuration illustrates a system for measurement of coaxial-line shielding effects called S4 indicated in the standard called EN55020 stipulated by the European Committee for Electrotechnical Standardization called Cenelec in Europe. A measurement-target tuner 41, a desired signal generator 42, a measuring probe 43, and an EMI (Electro-Magnetic Interference: electro-magnetic interference) measurement device 44 are provided.

An antenna-signal input connector 41a of the measurement-target tuner 41 and the measuring probe 43 are connected by a coaxial cable (75Ω) 45, and the desired signal generator 42 and the measuring probe 43 are connected by an impedance matching device 46 and a coaxial cable 47. The impedance matching device 46 performs impedance conversion (50Ω→75Ω). A high-frequency signal generated by the desired signal generator 42 is supplied to the measurement-target tuner 41, and a leaked signal induced to the outer covering (ground line) of the coaxial cable 45 by the measuring probe 43 is measured by the EMI measurement device 44. Measurement is performed for determining that the shielding effect of the coaxial cable 45 does not deteriorate due to an input circuit of the measurement-target tuner 41.

Table 1 illustrates one example of measurement results. Table 1 illustrates measurement values obtained by using 950 MHz with which the lowest shielding effect has been obtained. The sample without an auxiliary piece corresponds to a measurement result of a conventional tuner module, and the sample A and the sample B to which auxiliary pieces are added correspond to tuner modules to which the present technology is applied. As can be known from Table 1, the present technology can improve shielding amounts.

TABLE 1

| Samples | Shielded Amounts |
| --- | --- |
| Without auxiliary piece | 63.6 dB |
| With auxiliary piece A | 66.3 dB |
| With auxiliary piece B | 67.3 dB |

4. Application Example

For example, an IC (circuit) as a terrestrial television broadcasting (TV) tuner-module function section or an IC (circuit) as a satellite broadcasting (BS) tuner-module function section, and electronic components are formed (mounted) on the circuit boards of the tuner modules described as the first embodiment, the second embodiment, and the third embodiment mentioned above. The tuner-module boards are mounted on circuit boards of television receivers, as one example.

A receiving device is at least partially constituted by using any of the tuner modules. The receiving device is configured to be able to receive terrestrial television broadcasting wave signals and satellite broadcasting wave signals, for example. The receiving device has a reception antenna that receives broadcasting wave signals, a tuner module having a frequency conversion function, and a demodulating section.

A first system of the receiving device includes a reception antenna, an antenna connector, a filter, a low-noise amplifier (Low Noise Amplifier: LNA), a tuner section, and a demodulating section. In addition, a second system of the receiving device includes a reception antenna, an antenna connector, a filter, a low-noise amplifier (LNA), a tuner section, and a demodulating section.

5. Modification

The embodiments of the present technology are explained specifically thus far, but the present technology is not limited by the embodiments mentioned above, and various types of modifications based on the technical ideas of the present technology are possible. In addition, the configurations, methods, steps, shapes, materials, numerical values and the like of the embodiments mentioned above can be combined with each other unless such combinations result in deviation from the gist of the present technology.

For example, although in the first embodiment mentioned above, the input connector 13 is an IEC connector, the input connector 13 may be an F connector. FIG. 15, FIG. 16, FIG. 17, and FIG. 18 illustrate the configuration in a case that an F connector 113 is used. Detailed explanations of the configuration are omitted since the configuration is similar to the configuration illustrated in FIG. 1, FIG. 2, FIG. 3, and FIG. 4, and the configuration has the leg portion 131 and the leg portions 132 and 133 of the auxiliary piece 114.

Note that the present technology can have configurations like the ones mentioned below.

(1)

A tuner module including:

an input connector;

a tuner case;

a circuit board; and an auxiliary piece, in which the auxiliary piece contacts a surface of the tuner case and is fixed to the surface of the tuner case, and part of the auxiliary piece is connected as a ground potential near a contact of a core wire of the input connector with the circuit board.

(2)

The tuner module according to (1), in which a plurality of input connectors is fixed to one surface of the tuner case.

(3)

The tuner module according to (1) or (2), in which the surface of the tuner case to which the auxiliary piece is fixed includes a surface to which the input connector is fixed.

(4)

The tuner module according to any one of (1) to (3), in which a hole to which the auxiliary piece is connected as the ground potential of the circuit board is formed by through-hole processing.

(5)

The tuner module according to any one of (1) to (4), in which fitting between a hole and a protrusion that are for fixation is used for a connecting portion of the auxiliary piece and the tuner case.

(6)

The tuner module according to any one of (1) to (4), in which the auxiliary piece is coupled with the surface of the tuner case by a solder joint.

(7)

The tuner module according to any one of (1) to (4), in which the auxiliary piece is coupled with the surface of the tuner case by non-screwing mechanical joining.

(8)

A receiving device including the tuner module according to (1).

REFERENCE SIGNS LIST 11, 111, 211 . . . Tuner case, 12, 112, 212 . . . Circuit board, 13, 113, 213 . . . Input connector, 14, 114, 214 . . . Auxiliary piece, 13a, 113a, 213a . . . Terminal section, 31, 131, 231 . . . Leg portion, 32, 132, 232 . . . Leg portion, 33, 133, 233 . . . Leg portion

The invention claimed is:

1. A tuner module comprising:
an input connector;
a tuner case;
a circuit board; and
an auxiliary piece including a base section and a raised section, the base section including an opening in plan view, wherein
the auxiliary piece contacts a surface of the tuner case and is fixed to the surface of the tuner case, and
part of the auxiliary piece, which is in the opening in a planar view, is connected as a ground potential near a contact of a core wire of the input connector with the circuit board.

2. The tuner module according to claim 1, wherein a plurality of input connectors is fixed to one surface of the tuner case.

3. The tuner module according to claim 1, wherein the surface of the tuner case to which the auxiliary piece is fixed includes a surface to which the input connector is fixed.

4. The tuner module according to claim 1, wherein a hole to which the auxiliary piece is connected as the ground potential of the circuit board is formed by through-hole processing.

5. The tuner module according to claim 1, wherein fitting between a hole and a protrusion that are for fixation is used for a connecting portion of the auxiliary piece and the tuner case.

6. The tuner module according to claim 1, wherein the auxiliary piece is coupled with the surface of the tuner case by a solder joint.

7. The tuner module according to claim 1, wherein the auxiliary piece is coupled with the surface of the tuner case by non-screwing mechanical joining.

8. A receiving device comprising the tuner module according to claim 1.

* * * * *